United States Patent
Zheng et al.

(10) Patent No.: US 11,415,645 B2
(45) Date of Patent: Aug. 16, 2022

(54) MAGNETIC SENSOR ARRAY WITH ONE TMR STACK HAVING TWO FREE LAYERS

(71) Applicant: Western Digital Technologies, Inc., San Jose, CA (US)

(72) Inventors: Yuankai Zheng, Fremont, CA (US); Christian Kaiser, San Jose, CA (US); Zhitao Diao, Fremont, CA (US); Chih-Ching Hu, Pleasanton, CA (US); Chen-jung Chien, Mountain View, CA (US); Yung-Hung Wang, San Jose, CA (US); Ming Mao, Dublin, CA (US); Ming Jiang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 96 days.

(21) Appl. No.: 16/730,746

(22) Filed: Dec. 30, 2019

(65) Prior Publication Data

US 2021/0055361 A1 Feb. 25, 2021

Related U.S. Application Data

(60) Provisional application No. 62/891,153, filed on Aug. 23, 2019.

(51) Int. Cl.
*G11B 5/39* (2006.01)
*G01R 33/09* (2006.01)
(Continued)

(52) U.S. Cl.
CPC ......... *G01R 33/098* (2013.01); *G01R 17/105* (2013.01); *G11B 5/3909* (2013.01);
(Continued)

(58) Field of Classification Search
None
See application file for complete search history.

(56) References Cited

U.S. PATENT DOCUMENTS

| | | | |
|---|---|---|---|
| 9,591,221 B2 | 3/2017 | Miller et al. | |
| 9,684,184 B2 | 6/2017 | Miller et al. | |

(Continued)

FOREIGN PATENT DOCUMENTS

| | | | |
|---|---|---|---|
| KR | 10-0284227 B1 | 3/2001 | |
| KR | 100824471 B1 | 4/2008 | |

(Continued)

OTHER PUBLICATIONS

Freitas, Paulo P.; "Spintronic Sensors", Invited Paper, Proceedings of the IEEE, vol. 104, No. 10, Oct. 2016 (25 pages).
(Continued)

*Primary Examiner* — Jefferson A Evans
(74) *Attorney, Agent, or Firm* — Patterson + Sheridan, LLP; Steven H. VerSteeg

(57) ABSTRACT

The present disclosure generally relates to a Wheatstone bridge array comprising TMR sensors and a method of fabrication thereof. In the Wheatstone bridge array, there are four distinct TMR sensors. The TMR sensors are all fabricated simultaneously to create four identical TMR sensors that have synthetic antiferromagnetic free layers as the top layer. The synthetic antiferromagnetic free layers comprise a first magnetic layer, a spacer layer, and a second magnetic layer. After forming the four identical TMR sensors, the spacer layer and the second magnetic layer are removed from two TMR sensors. Following the removal of the spacer layer and the second magnetic layer, a new magnetic layer is formed on the now exposed first magnetic layer such that the new magnetic layer has substantially the same thickness as the spacer layer and second magnetic layer combined.

17 Claims, 9 Drawing Sheets

(51) Int. Cl.
  *G01R 17/10* (2006.01)
  *H01L 43/08* (2006.01)
(52) U.S. Cl.
  CPC .......... *G11B 5/3945* (2013.01); *G11B 5/3958* (2013.01); *H01L 43/08* (2013.01)

(56) References Cited

U.S. PATENT DOCUMENTS

| | | | | |
|---|---|---|---|---|
| 9,910,106 | B2* | 3/2018 | Mather | G01R 33/098 |
| 10,354,679 | B2* | 7/2019 | Biskeborn | G11B 5/3909 |
| 10,712,176 | B2* | 7/2020 | Zimmer | G01R 33/02 |
| 10,777,222 | B1* | 9/2020 | Liu | G11B 5/3906 |
| 10,964,604 | B2* | 3/2021 | Uchida | H01L 43/08 |
| 2003/0123197 | A1* | 7/2003 | Mizuguchi | B82Y 25/00 360/313 |
| 2005/0122635 | A1* | 6/2005 | Freitag | B82Y 25/00 360/324.11 |
| 2007/0086121 | A1 | 4/2007 | Nagase et al. | |
| 2008/0088986 | A1* | 4/2008 | Horng | B82Y 25/00 360/324.2 |
| 2009/0122450 | A1* | 5/2009 | Wang | B82Y 25/00 360/324.2 |
| 2009/0268351 | A1 | 10/2009 | Zeltser | |
| 2009/0279212 | A1* | 11/2009 | Engel | H01F 10/3272 360/314 |
| 2013/0058162 | A1* | 3/2013 | Yamanaka | G11C 11/1673 365/173 |
| 2013/0241542 | A1* | 9/2013 | Raberg | G01R 33/095 324/252 |
| 2017/0125481 | A1* | 5/2017 | Kan | H01L 43/12 |
| 2018/0040667 | A1* | 2/2018 | Kim | H01L 43/12 |
| 2018/0123027 | A1* | 5/2018 | Yamane | H01L 43/08 |
| 2018/0219152 | A1 | 8/2018 | Apalkov et al. | |
| 2019/0020822 | A1 | 1/2019 | Sharma et al. | |
| 2019/0066746 | A1 | 2/2019 | Li et al. | |
| 2019/0189906 | A1* | 6/2019 | Lee | H01L 43/02 |
| 2021/0063506 | A1* | 3/2021 | Wang | H01F 10/325 |
| 2021/0063507 | A1* | 3/2021 | Zheng | G01R 17/105 |
| 2021/0063508 | A1* | 3/2021 | Hu | H01L 43/12 |
| 2021/0065509 | A1* | 3/2021 | Perrie | G07F 17/3211 |
| 2021/0405131 | A1* | 12/2021 | Liu | G01R 33/091 |

FOREIGN PATENT DOCUMENTS

| | | |
|---|---|---|
| KR | 10-2018-0089847 A | 8/2018 |
| WO | 2010102107 A1 | 9/2010 |

OTHER PUBLICATIONS

Zhengqi, Lu et al.; "Doubly Exchange-Biased FeMn/NiFe/Cu/NiFe/CrMnPt Spin Valves", IEEE Transactions on Magnetics, vol. 36, No. 5, Sep. 2000 (3 pages).

International Search Report and Written Opinion issued in corresponding International Patent Application No. PCT/US2020/025872, dated Jul. 17, 2020 (11 pages).

International Preliminary Report on Patentability for International Application No. PCT/US2020/025872 dated Mar. 3, 2022, 8 pages.

* cited by examiner

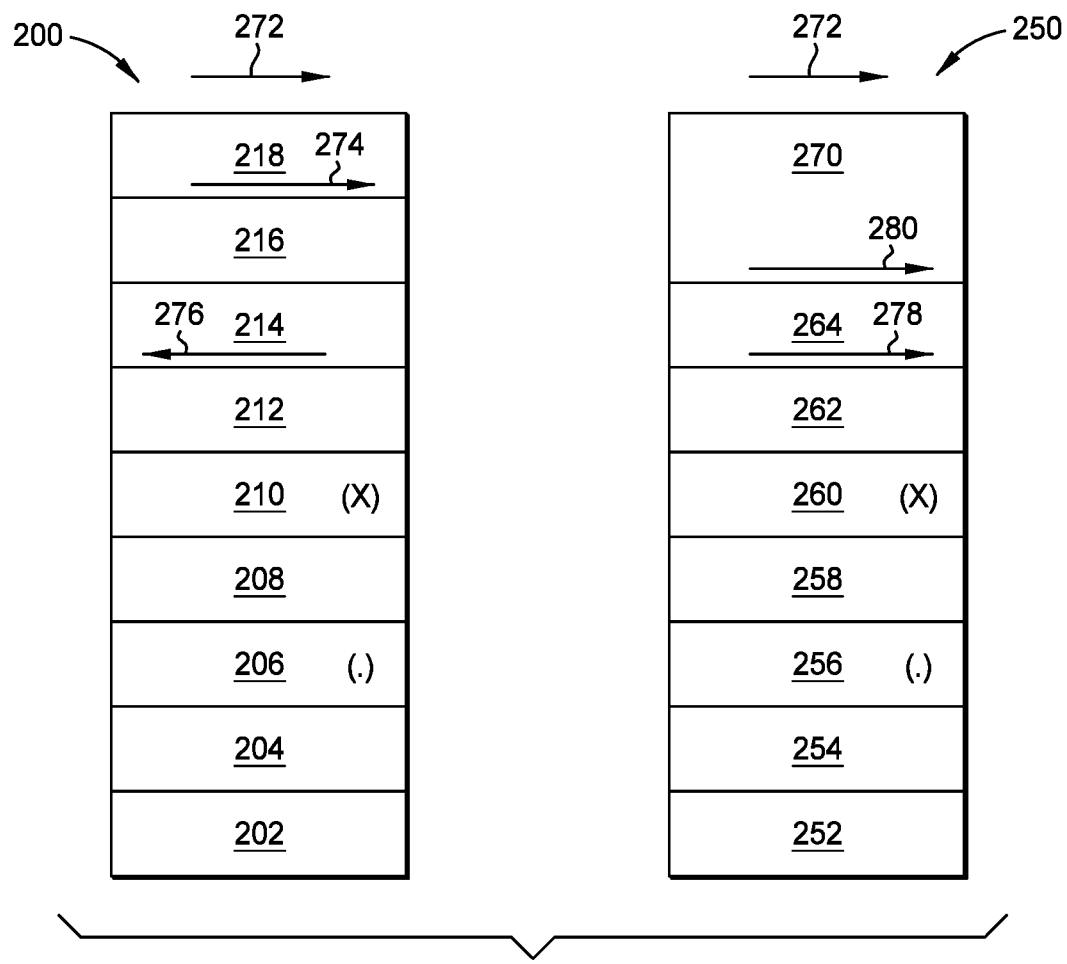
FIG. 2K
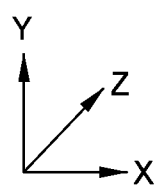

MAGNETIC SENSOR ARRAY WITH ONE TMR STACK HAVING TWO FREE LAYERS

CROSS-REFERENCE TO RELATED APPLICATIONS

This application claims benefit of U.S. Provisional Patent Application Ser. No. 62/891,153, filed Aug. 23, 2019, which is herein incorporated by reference.

BACKGROUND OF THE DISCLOSURE

Field of the Disclosure

Embodiments of the present disclosure generally relate to a Wheatstone bridge array and a method of manufacture thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as a magnetic sensors. Magnetic sensors can include Hall effect magnetic sensors, anisotropy magnetoresistive sensors (AMR), giant magnetoresistive (GMR) sensors, and tunnel magnetoresistive (TMR) sensors. The TMR sensor has a very high sensitivity compared to other magnetic sensors.

The reliability and performance of TMR sensors determine the magnetoresistance response. Various factors impact the reliability and performance of TMR sensors such as the materials of the TMR sensor, and, more importantly the method of fabricating the TMR sensor. For example, while the exact same materials may be used to fabricate two different TMR sensors, the TMR sensors will have different reliability and performance due to the different fabrication processes.

Therefore, there is a need in the art for a TMR sensor, and method of fabricating thereof, that delivers good reliability and performance.

SUMMARY OF THE DISCLOSURE

The present disclosure generally relates to a Wheatstone bridge array comprising TMR sensors and a method of fabrication thereof. In the Wheatstone bridge array, there are four distinct TMR sensors. The TMR sensors are all fabricated simultaneously to create four identical TMR sensors that have synthetic antiferromagnetic free layers as the top layer. The synthetic antiferromagnetic free layers comprise a first magnetic layer, a spacer layer, and a second magnetic layer. After forming the four identical TMR sensors, the spacer layer and the second magnetic layer are removed from two TMR sensors. Following the removal of the spacer layer and the second magnetic layer, a new magnetic layer is formed on the now exposed first magnetic layer such that the new magnetic layer has substantially the same thickness as the spacer layer and second magnetic layer combined.

In one embodiment, a TMR sensor device comprises: a first TMR sensor; and a second TMR sensor, wherein the second TMR sensor includes two distinct magnetic layers disposed in contact with one another.

In another embodiment, a TMR sensor device comprises: a first TMR sensor, wherein the first TMR sensor includes a free layer; and a second TMR sensor, wherein the second TMR sensor includes a free layer that is different from the first TMR sensor free layer.

In another embodiment, a method of fabricating a TMR sensor device comprises: fabricating a first TMR sensor and a second TMR sensor; removing a first layer from the second TMR sensor; removing a second layer from the second TMR sensor to expose a free magnetic layer; and depositing a magnetic layer on the exposed free magnetic layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A-2K are schematic illustrations of two TMR sensors at various stages of manufacture.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a Wheatstone bridge array comprising TMR sensors and a method of fabrication thereof. In the Wheatstone bridge array, there are four distinct TMR sensors. The TMR sensors are all fabricated simultaneously to create four identical TMR sensors that have synthetic antiferromagnetic free layers as the top layer. The synthetic antiferromagnetic free layers comprise a first magnetic layer, a spacer layer, and a second magnetic layer. After forming the four identical TMR sensors, the spacer layer and the second magnetic layer are removed from two TMR sensors. Following the removal of the spacer layer and the second magnetic layer, a new magnetic layer is formed on the now exposed first magnetic layer such that the new magnetic layer has substantially the same thickness as the spacer layer and second magnetic layer combined.

Figure 1:
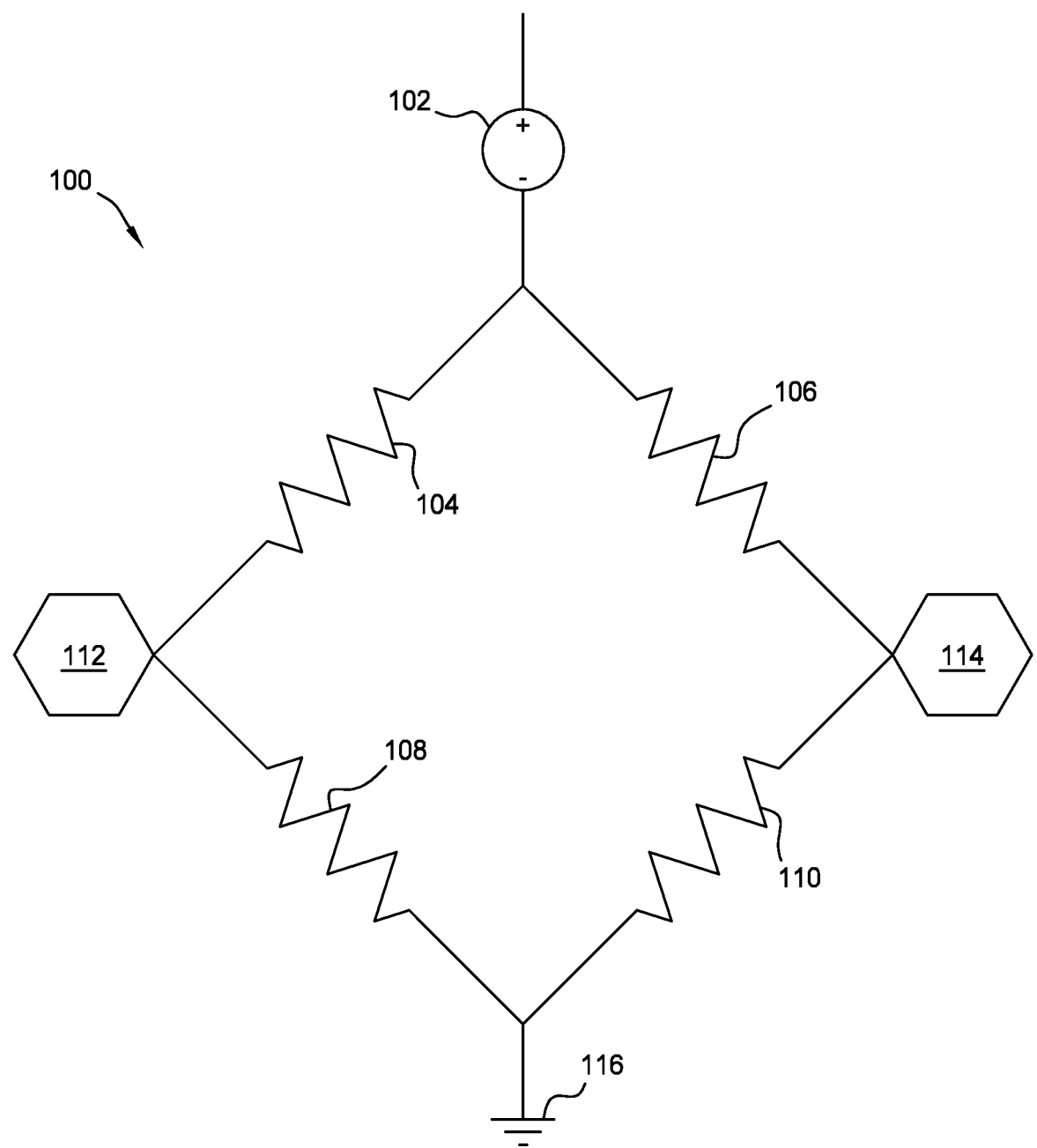
FIG. 1 is a schematic illustration of a Wheatstone bridge array design.

FIG. 1 is a schematic illustration of a Wheatstone bridge array 100 design. The array 100 includes a bias source 102, a first resistor 104, a second resistor 106, a third resistor 108, a fourth resistor 110, a first sensor output pad 112, a second sensor output pad 114, and a ground connection 116. Bias voltage is applied across the array from the bias source 102 to the ground connection 116. The first sensor output pad 112 and the second sensor output pad 114 sense the output of the applied voltage. Any temperature change from the resistors 104, 106, 108, 110 can be cancelled.

As discussed herein, the resistors 104, 106, 108, 110 each include a TMR sensor. In one embodiment, the TMR sensors are each distinct and different such that the resistors 104, 106, 108, 110 have different resistance. In another embodiment, the TMR sensors are identical, but the resistors 104, 106, 108, 110 are different. In still another embodiment, resistors 104, 110 are identical to each other (as are the TMR sensors that comprise the resistors 104, 110), and resistors 106, 108 are identical to each other (as are the TMR sensors that comprise the resistors 106, 108) yet different from resistors 104, 110. For a TMR sensor in array 100, the RA for the array 100 is around 100 Ohms microns$^2$.

Typical magnetic field sensors use MR (magnetoresistance) devices in a Wheatstone bridge circuit. The sensor requires the MR devices to change differently in the bridge. As discussed herein, a new method to make a magnetic field sensor is to fabricate two different TMR films in the same layer. The reliability and performance of the TMR films determines the magnetoresistance response. In this way, combined with different TMR films features, a perfect Wheatstone bridge design for magnetic field sensor can be fabricated.

In regards to FIG. 1, if the free layer of the TMR sensors that comprises the resistors 104, 106, 108, 110 has a long axis of +45° or −45° to the pinned layer magnetization direction, then the free layer easy axis is restricted to be along the long axis due to the shape anisotropy, and the magnetization direction can be set as shown in the cartoon by an ampere field from the set line current, especially if on top of the free layer there is a set line orthogonal to the free layer long axis.

When applying a magnetic field along the Y-axis, resistors 110 and 104 are increasing while resistors 106, 108 are decreasing with the field. This different response enables the Wheatstone bridge, and the sensor sensitivity is proportional to the output voltage which is proportional to the difference between resistor 110 (or resistor 104) and resistor 106 (or resistor 108). However, in only use half of the magnetoresistance change is used due to the 45° free layer or pinned layer initial state. If the free layer to pinned layer initial state can be 90° and still have two different magnetoresistance change, the sensor sensitivity can be increased by a factor of two.

If the free layer and pinned layer are orthogonal, then the pinned layer magnetization direction is set by magnetic annealing direction. Usually resistors 104, 106, 108, 110 are made by the same TMR film and experience the same processes, and therefore all have the same pinned layer direction. Each device can operate in full MR ratio, but all the devices respond to the external field in the same way and consequently there is no output voltage at all. A simple way to resolve this issue is to shield resistor 106 and resistor 108 by covering with a thick NiFe film so that resistor 106 and resistor 108 will not respond to magnetic fields. Alternatively, resistors 106 and 108 can be replaced with constant resistors. However, this kind of half bridge-sensing scheme will also reduce the output voltage and therefore limits the sensitivity.

FIGS. 2A-2K are schematic illustrations of two TMR sensors 200, 250 at various stages of manufacture. The TMR sensors 200, 250 each include a seed layer 202, 252 that will be formed on a bottom lead (not shown). In one embodiment, the seed layers 202, 252 comprise a conductive material such as ruthenium and has a thickness of between about 10 Angstroms to about 100 Angstroms and is deposited by well-known deposition methods such as electroplating, electroless plating, or sputtering. Additionally, it is to be understood that while ruthenium has been exemplified as the seed layers 202, 252 material, other materials are contemplated and the embodiments discussed herein are not limited to ruthenium for the seed layers 202, 252. Additionally, the seed layers 202, 252 are deposited simultaneously.

Figure 2A:
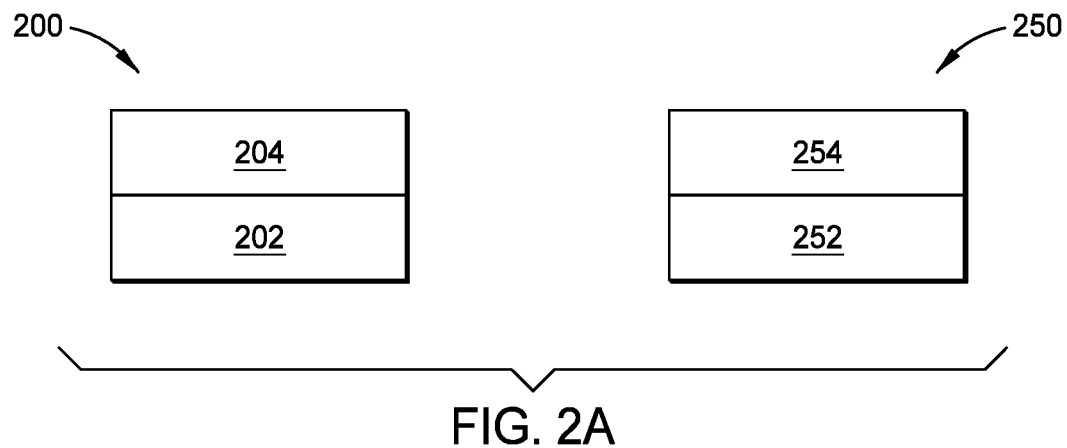

As shown in FIG. 2A, antiferromagnetic (AFM) layers 204, 254 are then disposed on the seed layers 204, 254. Suitable materials for the AFM layers 204, 254 include IrMn or PtMn at a thickness of between about 40 Angstroms to about 500 Angstroms. The AFM layers 204, 254 may be formed by well-known deposition methods such as sputtering. Additionally, it is to be understood that while IrMn and PtMn have been exemplified as the AFM layers 204, 254 materials, other materials are contemplated and the embodiments discussed herein are not limited to IrMn or PtMn for the AFM layers 204, 404. Additionally, the AMF layers 204, 254 are deposited simultaneously.

Figure 2B:
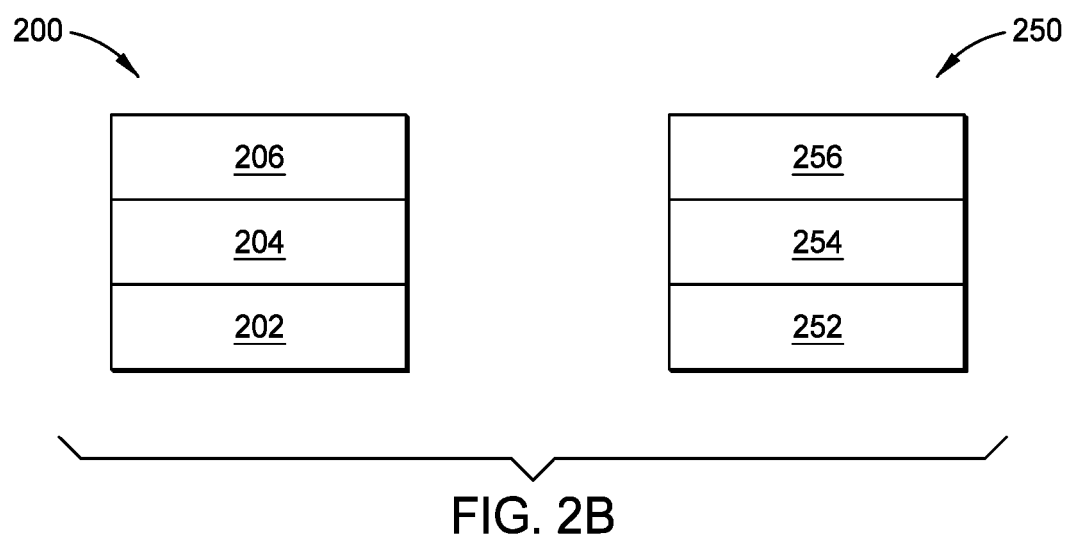

As shown in FIG. 2B, pinned layers 206, 256 are disposed on the AFM layers 204, 254. Suitable materials for the pinner layers 206, 256 include CoFe, or a Co/CoFe/Co multi-layer stack with a thickness of between about 20 Angstroms and about 30 Angstroms. The pinned layers 206, 256 may be formed by well-known deposition methods such as sputtering. Additionally, it is to be understood that while CoFe or Co/CoFe/Co have been exemplified as the pinned layers 206, 256 material, other materials are contemplated and the embodiments discussed herein are not limited to CoFe or Co/CoFe/Co for the pinned layers 206, 256. Additionally, the pinned layers 206, 256 are deposited simultaneously.

Figure 2C:
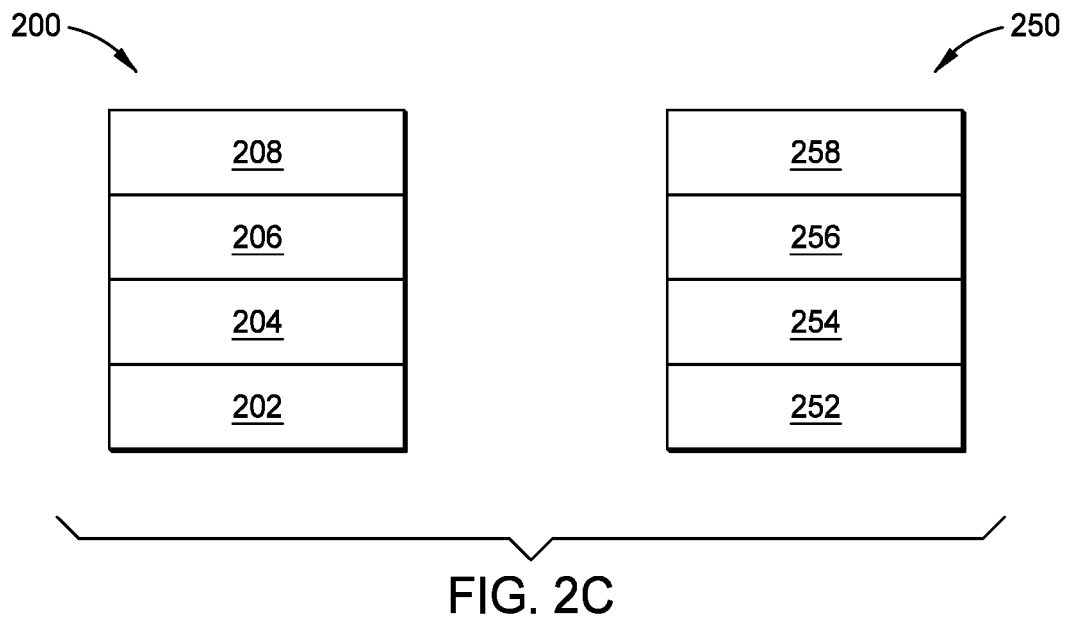

As shown in FIG. 2C, spacer layers 208, 258 are disposed on the pinned layers 206, 256. Suitable materials for the spacer layers 208, 258 includes Ru at a thickness of between about 4 Angstroms to about 10 Angstroms. The spacer layers 208, 258 may be formed by well-known deposition methods such as sputtering. Additionally, it is to be understood that while ruthenium has been exemplified as the spacer layers 208, 258 material, other materials are contemplated and the embodiments discussed herein are not limited to ruthenium for the spacer layers 208, 258. Additionally, the spacer layers 208, 258 are deposited simultaneously.

Figure 2D:
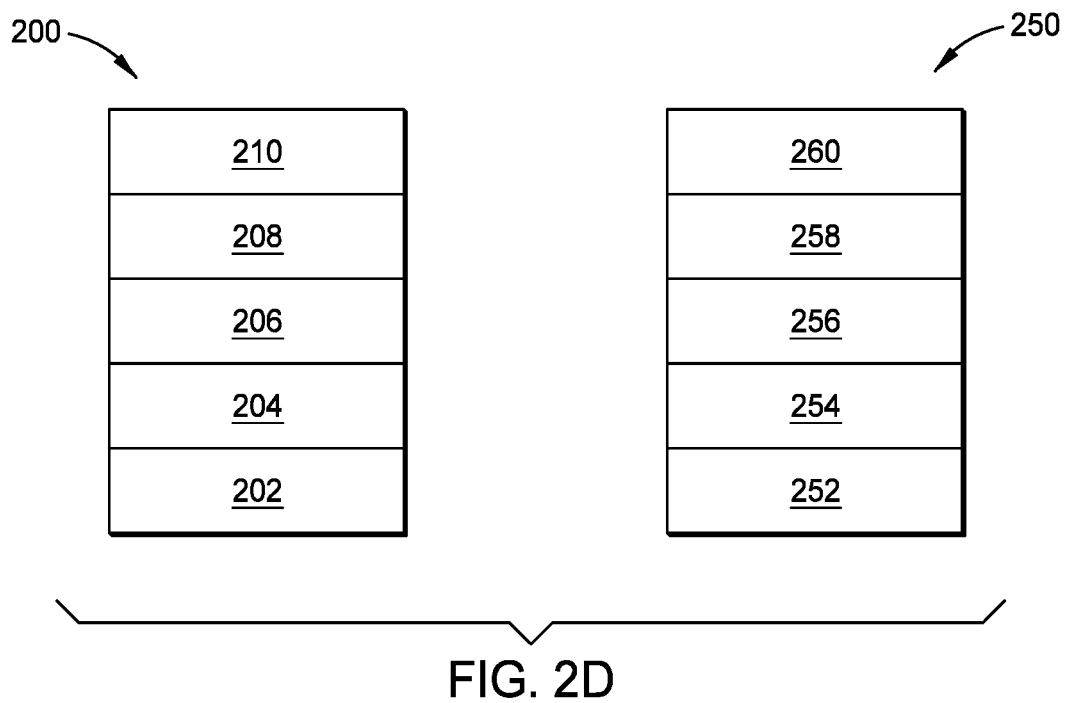

As shown in FIG. 2D, reference layers 210, 260 are disposed on the spacer layers 208, 258. Suitable materials for the reference layers 210, 260 include CoFe/Ta/CoFeB/CoFe as a multilayer stack. The CoFe layer may have a thickness of between about 8 Angstroms to about 10 Angstroms. The Ta layer may have a thickness of between about 0.5 Angstroms to about 2 Angstroms. The CoFeB layer may have a thickness of between about 10 Angstroms to about 15 Angstroms. The second CoFe layer may have a thickness of between about 3 Angstroms to about 10 Angstroms. The reference layers 210, 260 may be formed by well-known deposition methods such as sputtering. Additionally, it is to be understood that while CoFe/Ta/CoFeB/CoFe has been exemplified as the reference layers 210, 260 material, other materials are contemplated and the embodiments discussed herein are not limited to CoFe/Ta/CoFeB/CoFe for the reference layers 210, 260. Additionally, the reference layers 210, 260 are deposited simultaneously.

Figure 2E:
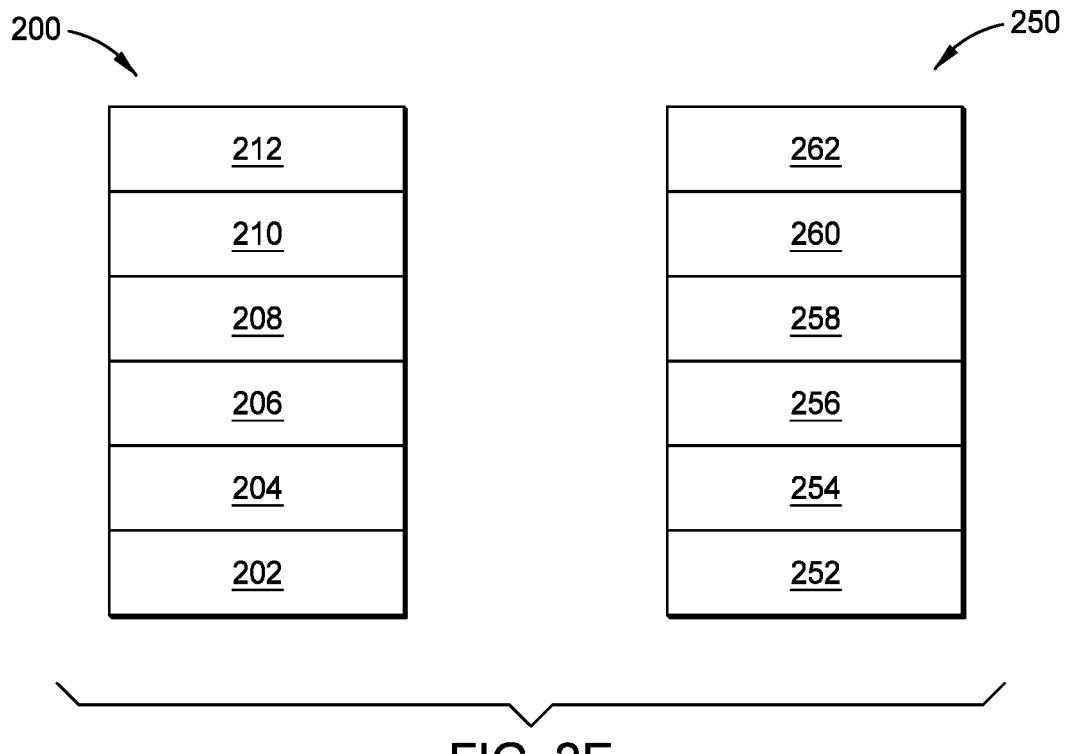

As shown in FIG. 2E, barrier layers 212, 262 are disposed on the reference layers 210, 260. Suitable material for the barrier layers 212, 262 include MgO at a thickness of between about 10 Angstroms to about 20 Angstroms. It is to be understood that while MgO is exemplified as the barrier layers 212, 262, other insulating materials as contemplated. Additionally, the barrier layers 212, 262, 252 are deposited simultaneously.

Figure 2F:
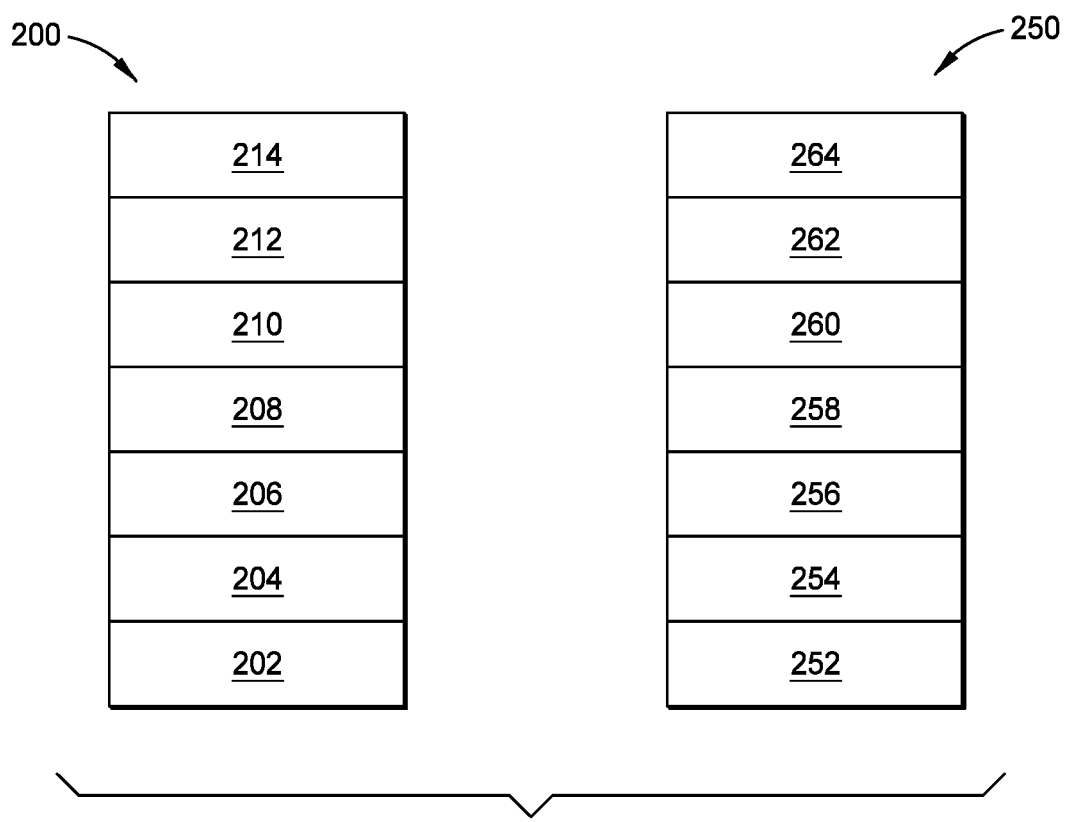

As shown in FIG. 2F, first free layers 214, 264 are disposed on the barrier layers 212, 262. Suitable materials for the first free layers 214, 264 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The first free layers 214, 264 may be formed by well-known deposition methods such as sputtering. Additionally, it is to be understood that while CoFe/CoFeB/Ta/NiFe has been exemplified as the first free layers 214, 264 material, other materials are contemplated and the embodiments discussed herein are not limited to CoFe/CoFeB/Ta/NiFe for the first free layers 214, 264. Additionally, the first free layers 214, 216, 252 are deposited simultaneously.

Figure 2G:
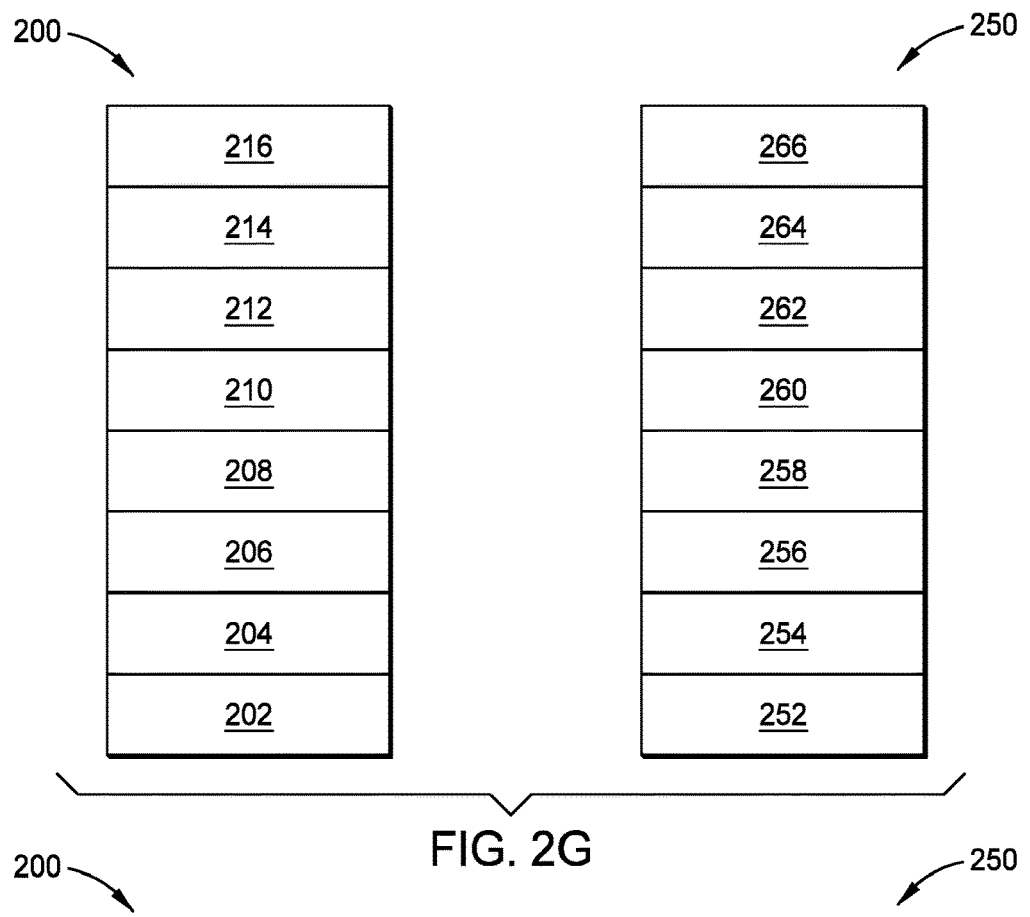

As shown in FIG. 2G, additional spacer layers 216, 266 are then formed on the first free layers 214, 264. In one embodiment, the spacer layers 216, 266 are multilayer structures comprising Co/Ru/Co. It is to be understood that the spacer layer 416 may be a single layer or other multilayer stacks that comprise a first magnetic layer, a non-magnetic conductive layer, and a second magnetic layer. In the embodiment where the spacer layers 216, 266 are Co/Ru/Co, the first Co layer can have a thickness of between about 3 Angstroms to about 6 Angstroms, the Ru layer can have a thickness of between about 6 Angstroms and about 10 Angstroms, and the second Co layer can have a thickness of between about 3 Angstroms to about 6 Angstroms. The Co layers are to enhance the synthetic antiferromagnetic (SAF) coupling. The spacer layers 216, 266 may be formed by well-known deposition methods such as sputtering. Additionally, the spacer layers 216, 266, are deposited simultaneously.

Figure 2H:
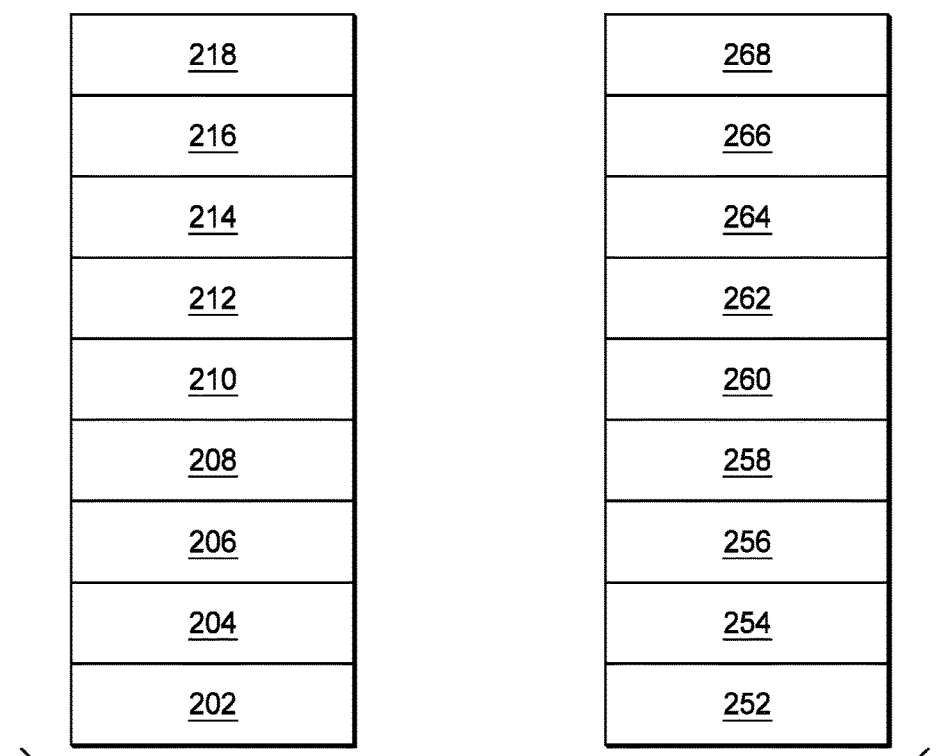

As shown in FIG. 2H, second free layers 218, 268 are then formed on the spacer layers 216, 266. Suitable materials for the second free layers 218, 268 include NiFe. The NiFe layer may have a thickness of between about 100 Angstroms to about 300 Angstroms, such as between about 100 Angstroms and about 200 Angstroms (the second free layer's 218, 268 moment is larger than the magnetic moment of the first free layer 214, 264) or between about 200 Angstroms and about 300 Angstroms. The second free layers 218, 268 may be formed by well-known deposition methods such as sputtering. Additionally, it is to be understood that while NiFe has been exemplified as the second free layers 218, 268 material, other materials are contemplated and the embodiments discussed herein are not limited to NiFe for the second free layers 218, 268. Additionally, the second free layers 218, 268, are deposited simultaneously. The first free layers 214, 264 together with the spacer layers 216, 266 and the second free layers 218, 268 collectively form an unbalanced synthetic AFM structure.

At this point, the TMR sensors 200, 250 are identical and have been fabricated simultaneously. Thus, the TMR sensors 200, 250 are formed only one time with the two sensors 200, 250 having the same RA and the same TMRs. For the Wheatstone bridge array, all of the sensors cannot be identical. Rather, resistors 104, 110 are identical to each other and resistors 106, 108 are identical to each other and different than resistors 104, 110. To make the resistors different, additional processing needs to occur to two of the resistors 106, 108. TMR sensor 250 will represent the resistors 106, 108 undergoing additional processing.

Figure 2I:
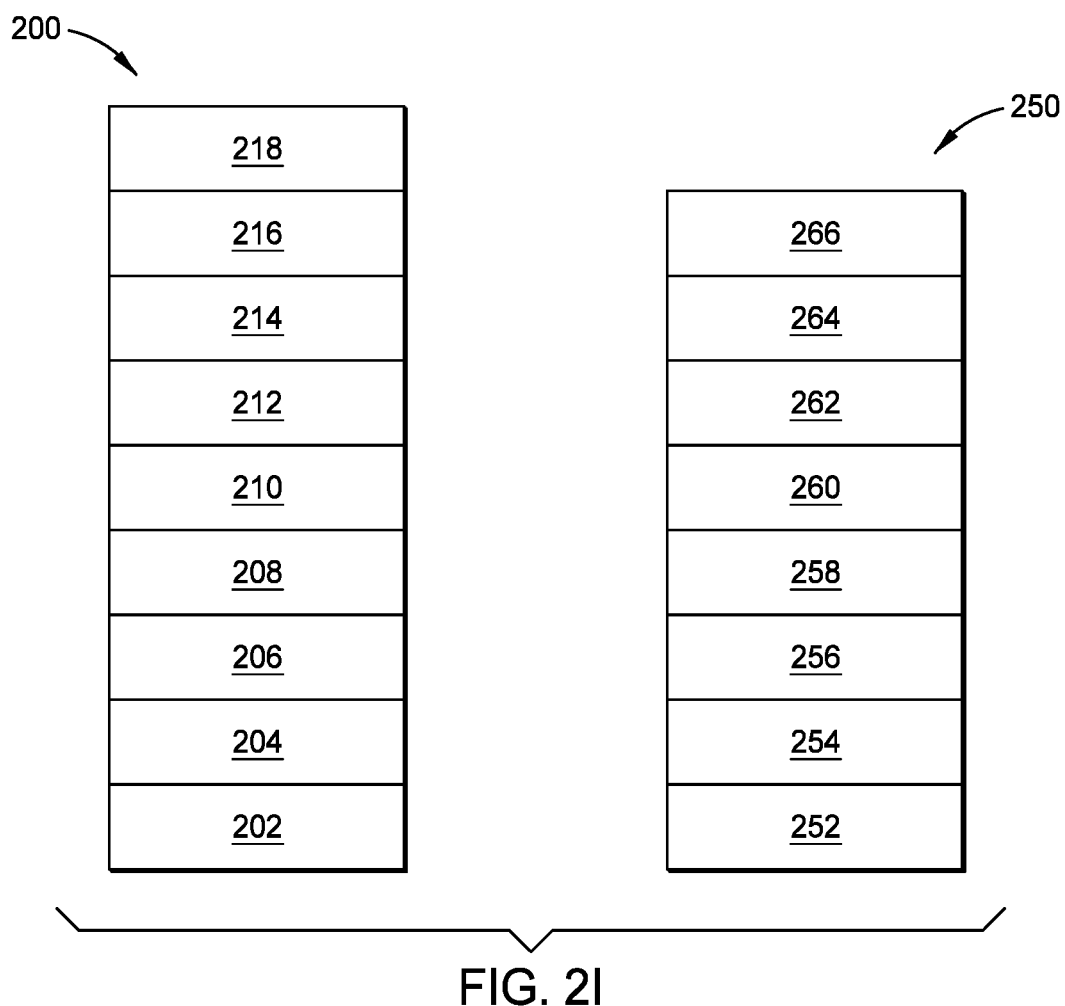

As shown in FIG. 2I, the second free layer 268 is removed from TMR sensor 250 while the second free layer 218 remains for the TMR sensor 200. The second free layer 268 is removed by well known processes such as ion milling, to expose the underlying spacer layer 266. The resulting structure shown in FIG. 2I has no second free layer 268 for TMR sensor 250, but an exposed spacer layer 266. The TMR sensor 200 is unchanged and still has a second free layer 218. TMR sensor 200 is masked during the removal process so that no material is removed from TMR sensor 200.

Figure 2J:
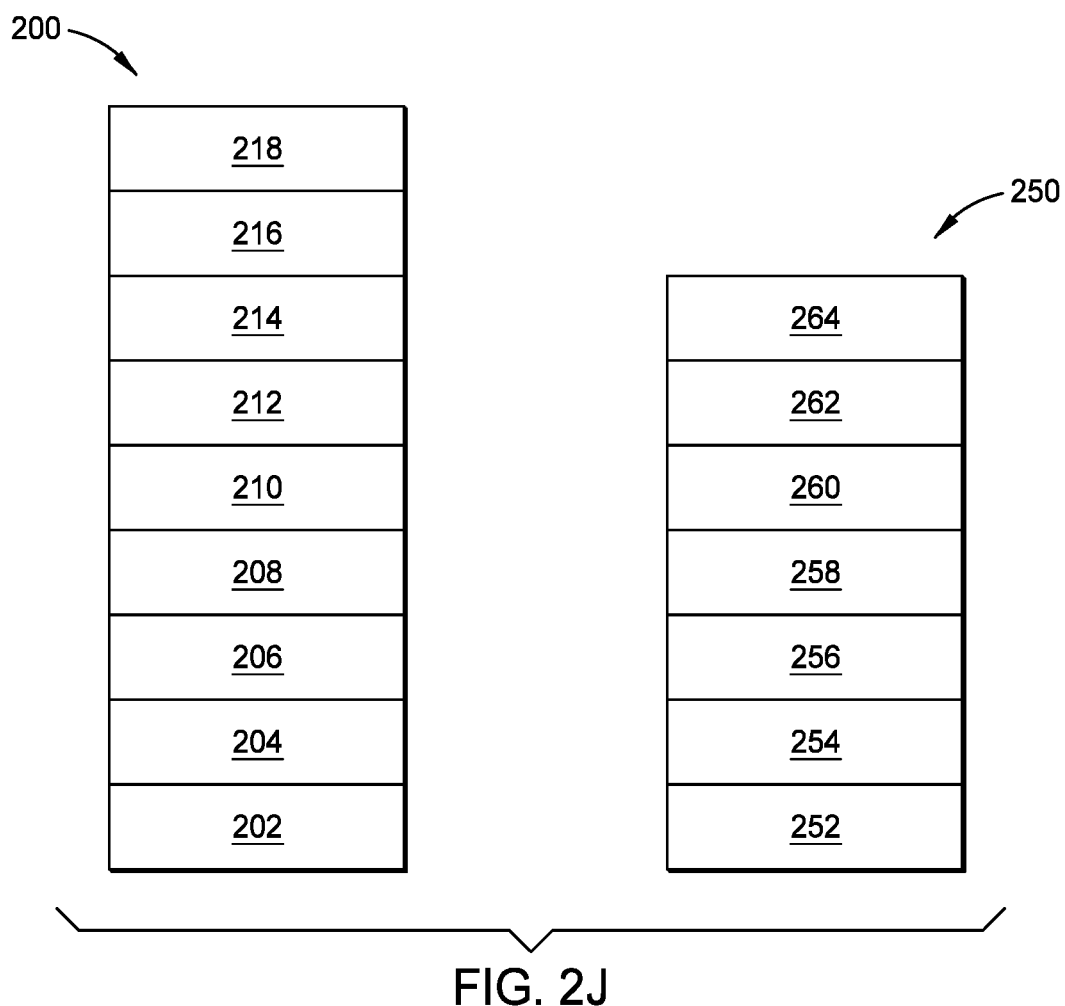

Thereafter, as shown in FIG. 2J, the spacer layer 266 is removed from TMR sensor 250. No material is removed from TMR sensor 200. Again, the TMR sensor 200 is masked during the removal process. The spacer layer 266 may be removed by well known processes such as ion milling, to expose the underlying first free layer 264. The resulting structure shown in FIG. 2J has no second free layer 268 and no spacer layer 266 for TMR sensor 250, but an exposed first free layer 264. The TMR sensor 200 is unchanged and still has both a second free layer 218 and a spacer layer 216. It is to be understood that while the spacer layer 266 removal and the second free layer 268 removal has been discussed as two separate processes, one continuous process may be used to remove both the second free layer 268 and the spacer layer 266.

Thereafter, as shown in FIG. 2K, another magnetic layer 270 is deposited on the exposed first free layer 264 of TMR 250. The another magnetic layer 270 is substantially identical to the second free layer 218, 268 in composition, but will have a thickness substantially equal to the collective thickness of the spacer layer 216, 266 and second free layer 218, 268. Suitable materials for the second magnetic layer 270 include NiFe that has a total thickness of between about 100 Angstroms and about 350 Angstroms. The NiFe layer may have a thickness of between about 100 Angstroms to about 300 Angstroms, such as between about 100 Angstroms and about 200 Angstroms or between about 200 Angstroms and about 300 Angstroms. The second free layers 218, 268 may be formed by well-known deposition methods such as sputtering or ion beam deposition. Additionally, it is to be understood that while NiFe has been exemplified as the second free layers 218, 268 material, other materials are contemplated and the embodiments discussed herein are not limited to NiFe for the second free layers 218, 268.

After formation of the second magnetic layer 270, capping layers may be formed over the second free layer 218 and the second magnetic layer 270. Thereafter, the resulting TMR sensors 200, 250 are annealed in a magnetic oven at a temperature of between about 250 degrees Celsius to about 300 degrees Celsius under a magnetic field of between about 10,000 Oe to about 50,000 Oe. It is to be understood that while the annealing has been discussed as occurring after the depositing of the second magnetic layer 270, it is contemplated that the annealing may occur after deposition of the second free layer 218, 268. The second magnetic layer 270 has a larger magnetic moment than that the first free layers 214, 264. It is to be understood that the second magnetic layer 270 is has a thickness that is greater than the thickness of the first free layer 264. In TMR sensor 250, the second magnetic layer 270 is ferromagnetically coupled to the first free layer 264 In TMR 250, the first free layer 264 will provide the magnetoresistance that has the opposite magnetic direction under the same bias field. The hard bias field HBias is shown by arrow 272. After annealing, the pinned layers 206, 256 are pinned in the −Z direction. When the hard bias field is applied, the reference layers 210, 260 have a magnetic moment in the +Z direction, the first free layer 214 of TMR sensor 200 has a magnetic moment shown by arrow 276 that is antiparallel to the magnetic moment shown by arrow 278 of the first free layer 264 of TMR sensor 250. Additionally, the second free layer 218 and the second magnetic layer 270 have magnetic moments shown by arrows 274, 280 that are parallel under the applied hard bias. As shown in FIG. 2K, the magnetic moment of the first free layer 214 is antiparallel to the magnetic moment of the second free layer 218 while the magnetic moment of the first free layer 264 is parallel to the magnetic moment of the second magnetic layer 270 under the same hard bias field.

Figure 3:
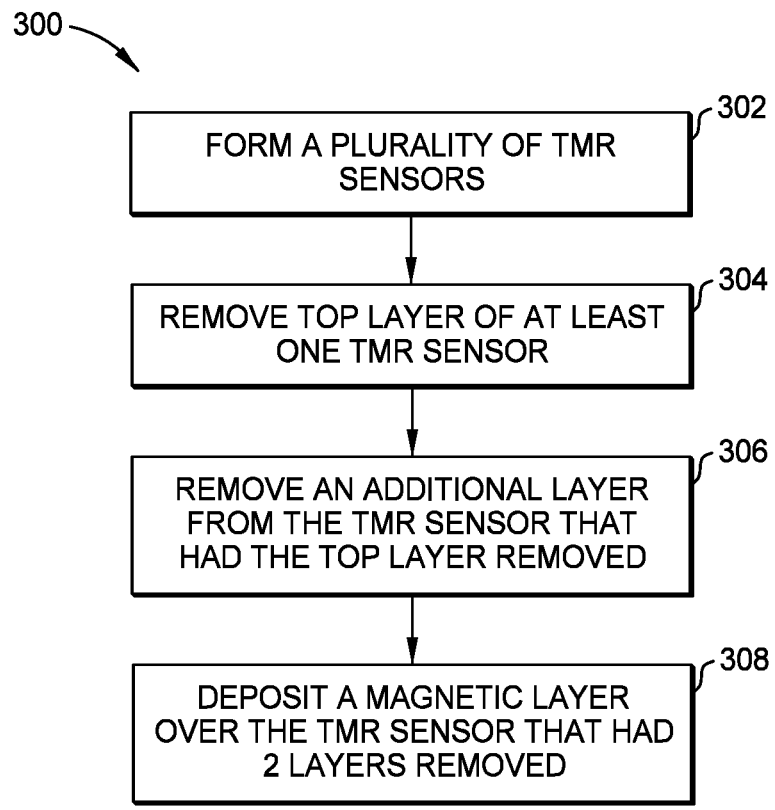
FIG. 3 is a flowchart illustrating a method of manufacturing the TMR sensors of FIGS. 2A-2K.

FIG. 3 is a flowchart illustrating a method 300 of manufacturing the TMR sensors of FIGS. 2A-2K. In step 302, a plurality of TMR sensors are formed. Thereafter, in step 304, the top layer of at least one TMR sensor is removed by a process such as ion milling or etching. Thereafter, in step 306, another layer is removed from the same TMR sensors in which the top layer was previously removed by a process such as ion milling. Thereafter, in step 308, a magnetic layer is formed by a process such as ion beam deposition or sputtering in the location where the top layer and another layer have been removed.

Figure 4:
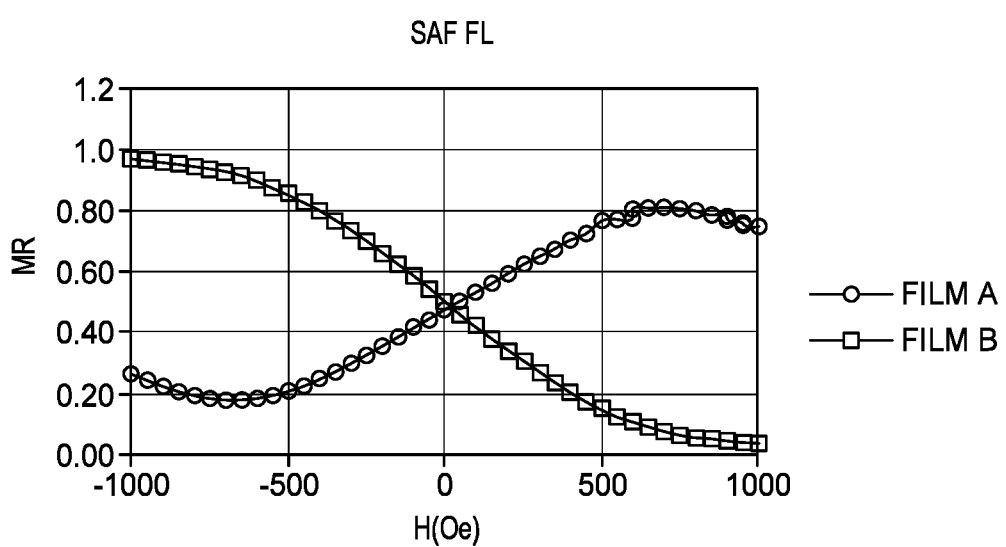
FIG. 4 is a graph illustrating the simulation results of the TMR sensors of FIG. 2K.

FIG. 4 is a graph illustrating the simulation results of the TMR sensors of FIG. 2K. As shown in FIG. 4, firm A, which is equivalent to TMR sensor 200, and film B, which is equivalent to TMR sensor 250, have essentially exact opposite magnetoresistance under an applied magnetic field.

In one embodiment, a TMR sensor device comprises: a first TMR sensor; and a second TMR sensor, wherein the second TMR sensor includes two distinct magnetic layers disposed in contact with one another. The first TMR sensor has a top layer of magnetic material and a layer in contact with the top layer, wherein the second TMR sensor includes a top layer of magnetic material that has a thickness that is substantially equal to a thickness of the top layer of magnetic material of the first TMR sensor and the layer in contact with the top layer of magnetic material of the first TMR sensor. The first TMR sensor has a first free magnetic layer, a spacer layer disposed on the first free magnetic layer, and a second free magnetic layer disposed on the spacer layer, wherein the first free magnetic layer and the second free magnetic layer are magnetically coupled in antiparallel. The second TMR sensor includes a first free magnetic layer and a second free magnetic layer disposed on the first free magnetic layer, wherein the first free magnetic layer and the second free magnetic layer are magnetically coupled in parallel. The second free magnetic layer of the second TMR sensor is thicker than the first free magnetic layer of the second TMR sensor. The array further comprises: a third TMR sensor; and a fourth TMR sensor, wherein the first TMR sensor and the third TMR sensor are substantially identical. The fourth TMR sensor and the second TMR sensor are substantially identical.

In another embodiment, a TMR sensor device comprises: a first TMR sensor, wherein the first TMR sensor includes a free layer; and a second TMR sensor, wherein the second TMR sensor includes a free layer that is different from the first TMR sensor free layer. The first TMR sensor includes an unbalanced synthetic antiferromagnetic free layer. The free layer of the second TMR sensor is a multi-layer structure. The free layer of the second TMR sensor comprises a first magnetic layer and a second magnetic layer disposed on the first magnetic layer. The first magnetic layer and the second magnetic layer are magnetically coupled in parallel. A bottom layer of the unbalanced synthetic antiferromagnetic free layer of the first TMR sensor is substantially identical to the first magnetic layer of the free layer of the second TMR sensor.

In another embodiment, a method of fabricating a TMR sensor device comprises: fabricating a first TMR sensor and a second TMR sensor; removing a first layer from the second TMR sensor; removing a second layer from the second TMR sensor to expose a free magnetic layer; and depositing a magnetic layer on the exposed free magnetic layer. Prior to removing the first layer from the second TMR sensor, the first TMR sensor and the second TMR sensor are substantially identical. The magnetic layer has a thickness substantially equal to a thickness of the first layer and the second layer combined. Removing the first layer of the second TMR sensor comprises ion milling the first layer. Removing the second layer of the second TMR sensor comprises ion milling the second layer. Depositing the magnetic layer is performed by an ion beam deposition process. Depositing the magnetic layer is performed by sputtering process.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

By forming TMR sensors simultaneously, and then changing the top two layers, only one annealing is necessary, fabrication throughput greatly increases.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) sensor device, comprising:
    a first TMR sensor, wherein the first TMR sensor has a first free magnetic layer, a spacer layer disposed on the first free magnetic layer, and a second free magnetic layer disposed on the spacer layer, wherein the first free magnetic layer and the second free magnetic layer are magnetically coupled in antiparallel;
    a second TMR sensor, wherein the second TMR sensor includes two distinct magnetic layers disposed in contact with one another;
    a third TMR sensor; and
    a fourth TMR sensor, wherein the first TMR sensor and the third TMR sensor are substantially identical.

2. The TMR sensor device of claim 1, wherein the second TMR sensor includes a first free magnetic layer and a second free magnetic layer disposed on the first free magnetic layer, wherein the first free magnetic layer and the second free magnetic layer are magnetically coupled in parallel.

3. The TMR sensor device of claim 2, wherein the second free magnetic layer of the second TMR sensor is thicker than the first free magnetic layer of the second TMR sensor.

4. The TMR sensor device of claim 1, wherein the fourth TMR sensor and the second TMR sensor are substantially identical.

5. A tunnel magnetoresistive (TMR) sensor device, comprising:
    a first TMR sensor, wherein the first TMR sensor has a first free magnetic layer, a spacer layer disposed on the first free magnetic layer, and a second free magnetic layer disposed on the spacer layer, wherein the first free magnetic layer and the second free magnetic layer are magnetically coupled in antiparallel; and
    a second TMR sensor, wherein the second TMR sensor includes two distinct magnetic layers disposed in contact with one another,
    wherein:
        the first TMR sensor has a top layer of magnetic material and a layer in contact with the top layer, and
        the second TMR sensor includes a top layer of magnetic material that has a thickness that is substantially equal to a thickness of the top layer of magnetic material of the first TMR sensor and the layer in contact with the top layer of magnetic material of the first TMR sensor.

6. A TMR sensor device, comprising:
    a first tunnel magnetoresistive (TMR) sensor, wherein the first TMR sensor includes a first free layer having a first magnetic moment, a spacer layer disposed on the first free layer, and a second free layer disposed on the first free layer, the second free layer having a second magnetic moment antiparallel to the first magnetic moment; and
    a second TMR sensor, wherein the second TMR sensor includes a third free layer that is different from both the first free layer and the second free layer, the third free layer of the second TMR sensor comprises a first magnetic layer and a second magnetic layer disposed on the first magnetic layer, wherein the first magnetic layer and the second magnetic layer each has the second magnetic moment.

7. The TMR sensor device of claim 6, further comprising a third TMR sensor, the second TMR sensor and the first TMR sensor being substantially identical.

8. The TMR sensor device of claim 7, further comprising a fourth TMR sensor, the fourth TMR sensor and the second TMR sensor being substantially identical.

9. A TMR sensor device, comprising:
    a first tunnel magnetoresistive (TMR) sensor, wherein the first TMR sensor includes a free layer; and
    a second TMR sensor, wherein the second TMR sensor includes a free layer that is different from the first TMR sensor free layer, wherein the first TMR sensor includes an unbalanced synthetic antiferromagnetic free layer.

10. The TMR sensor device of claim 9, wherein the free layer of the second TMR sensor is a multi-layer structure.

11. The TMR sensor device of claim 10, wherein the free layer of the second TMR sensor comprises a first magnetic layer and a second magnetic layer disposed on the first magnetic layer.

12. The TMR sensor device of claim 11, wherein the first magnetic layer and the second magnetic layer are magnetically coupled in parallel.

13. The TMR sensor device of claim 12, wherein a bottom layer of the unbalanced synthetic antiferromagnetic free layer of the first TMR sensor is substantially identical to the first magnetic layer of the free layer of the second TMR sensor.

14. A tunnel magnetoresistive (TMR) sensor device, comprising:
    a first TMR sensor, wherein the first TMR sensor has a top layer of magnetic material and a layer in contact with the top layer; and
    a second TMR sensor, wherein the second TMR sensor comprises:
        two distinct magnetic layers disposed in contact with one another, and
        a top layer of magnetic material that has a thickness that is substantially equal to a thickness of the top layer of magnetic material of the first TMR sensor and the layer in contact with the top layer of magnetic material of the first TMR sensor.

15. The TMR sensor device of claim 14, further comprising:
    a third TMR sensor; and
    a fourth TMR sensor.

16. The TMR sensor device of claim 15, wherein the first TMR sensor and the third TMR sensor are substantially identical.

17. The TMR sensor device of claim 15, wherein the fourth TMR sensor and the second TMR sensor are substantially identical.

* * * * *